(12) United States Patent
Mathur et al.

(10) Patent No.: US 12,170,310 B2
(45) Date of Patent: Dec. 17, 2024

(54) INTEGRATED CIRCUITS INCLUDING COMPOSITE DIELECTRIC LAYER

(71) Applicant: TEXAS INSTRUMENTS INCORPORATED, Dallas, TX (US)

(72) Inventors: Guruvayurappan S. Mathur, Plano, TX (US); Abbas Ali, Plano, TX (US); Poornika Fernandes, Murphy, TX (US); Bhaskar Srinivasan, Allen, TX (US); Darrell R. Krumme, Waxahachie, TX (US); Joao Sergio Afonso, Allen, TX (US); Shih-Chang Chang, Allen, TX (US); Shariq Arshad, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/453,796

(22) Filed: Jun. 26, 2019

(65) Prior Publication Data

US 2020/0411633 A1 Dec. 31, 2020

(51) Int. Cl.
*H01L 21/8238* (2006.01)
*H01L 21/336* (2006.01)
*H01L 21/8234* (2006.01)
*H01L 27/06* (2006.01)
*H01L 49/02* (2006.01)

(52) U.S. Cl.
CPC .......... *H01L 28/40* (2013.01); *H01L 27/0629* (2013.01)

(58) Field of Classification Search
CPC ................ H01L 27/0629; H01L 28/40; H01L 21/02211; H01L 21/0217
See application file for complete search history.

(56) References Cited

U.S. PATENT DOCUMENTS

| | | | | |
|---|---|---|---|---|
| 4,681,653 A | * | 7/1987 | Purdes | H01L 21/02164 257/E21.279 |
| 4,811,076 A | | 3/1989 | Tigelaar et al. | |
| 4,811,078 A | | 3/1989 | Tigelaar et al. | |
| 5,716,875 A | * | 2/1998 | Jones, Jr. | H01L 27/0629 438/210 |

(Continued)

OTHER PUBLICATIONS

PCT Search Report for Application No. 2020/039052, dated Oct. 18, Sep. 17, 2020.

(Continued)

*Primary Examiner* — Ismail A Muse
(74) *Attorney, Agent, or Firm* — Andrew R. Ralston; Frank D. Cimino

(57) ABSTRACT

In some examples, an integrated circuit includes an isolation layer disposed on or over a semiconductor substrate. The integrated circuit also includes a first conductive plate located over the isolation layer and a composite dielectric layer located over the first conductive plate. The composite dielectric layer includes a first sublayer comprising a first chemical composition; a second sublayer comprising a second different chemical composition; and a third sublayer comprising a third chemical composition substantially similar to the first chemical composition. The integrated circuit further includes a second conductive plate located directly on the composite dielectric layer above the first conductive plate.

20 Claims, 8 Drawing Sheets

(56) References Cited

U.S. PATENT DOCUMENTS

| | | | | |
|---|---|---|---|---|
| 6,313,516 | B1* | 11/2001 | Tsui | H01L 27/0629 257/532 |
| 6,355,571 | B1* | 3/2002 | Huang | H01L 23/53238 438/706 |
| 7,009,226 | B1* | 3/2006 | Sun | H01L 21/0214 257/900 |
| 9,287,346 | B2* | 3/2016 | Lee | H01L 27/0794 |
| 2003/0178666 | A1* | 9/2003 | Lee | H01L 28/40 257/311 |
| 2003/0183880 | A1* | 10/2003 | Goto | H01L 27/0629 257/379 |
| 2004/0152333 | A1* | 8/2004 | Zhao | H01L 21/76834 438/754 |
| 2005/0269663 | A1* | 12/2005 | Minami | H01L 27/105 257/E21.679 |
| 2006/0068541 | A1* | 3/2006 | Chidambaram | H01L 21/823814 257/E21.64 |
| 2006/0113641 | A1* | 6/2006 | Hohage | H01L 21/823412 257/640 |
| 2006/0197134 | A1* | 9/2006 | Phan | H01L 28/40 257/532 |
| 2008/0251850 | A1* | 10/2008 | Bu | H01L 21/76828 257/E27.06 |
| 2008/0293254 | A1* | 11/2008 | Ramkumar | H01L 29/40117 257/E21.267 |
| 2011/0089497 | A1* | 4/2011 | Fukutome | H01L 29/6659 257/E21.619 |
| 2013/0334659 | A1* | 12/2013 | Liu | H01L 21/02164 257/532 |
| 2014/0175435 | A1* | 6/2014 | Yamazaki | H01L 29/7869 257/43 |
| 2015/0187598 | A1 | 7/2015 | Campbell et al. | |
| 2015/0236156 | A1* | 8/2015 | Uejima | H01L 29/0653 257/288 |
| 2015/0349254 | A1* | 12/2015 | Chang | H10N 70/011 257/528 |
| 2016/0079343 | A1* | 3/2016 | Liu | H01L 21/76877 438/396 |
| 2017/0207299 | A1* | 7/2017 | Lin | H01L 21/76895 |
| 2017/0317217 | A1* | 11/2017 | Ito | H01L 29/7869 |
| 2019/0157077 | A1* | 5/2019 | Tsiang | C23C 16/56 |

OTHER PUBLICATIONS

Temple-Boyer, P., et al. "Residual stress in low pressure chemical vapor deposition SiNx films deposited from silane and ammonia." Journal of Vacuum Science & Technology A: Vacuum, Surfaces, and Films 16.4 (1998): 2003-2007.

* cited by examiner

US 12,170,310 B2

INTEGRATED CIRCUITS INCLUDING COMPOSITE DIELECTRIC LAYER

SUMMARY

In accordance with some examples of the disclosure, an integrated circuit includes an isolation layer disposed on or over a semiconductor substrate. The integrated circuit also includes a first conductive plate located over the isolation layer and a composite dielectric layer located over the first conductive plate. The composite dielectric layer includes a first sublayer comprising a first chemical composition; a second sublayer comprising a second different chemical composition; and a third sublayer comprising a third chemical composition substantially similar to the first chemical composition. The integrated circuit further includes a second conductive plate located directly on the composite dielectric layer above the first conductive plate.

In accordance with some examples of the disclosure, a method of manufacturing an integrated circuit includes providing a semiconductor substrate, where the semiconductor substrate includes an isolation layer disposed on or over the semiconductor substrate; and a first conductive plate located over the isolation layer. The method further includes forming a composite dielectric layer over the first conductive plate, where the composite dielectric layer includes a first sublayer and a second sublayer each having a substantially same first chemical composition. The method then includes forming a third sublayer between the first and second sublayers, the third sublayer having a second different chemical composition; and forming a second conductive plate located directly on the composite dielectric layer.

BRIEF DESCRIPTION OF THE DRAWINGS

For a detailed description of various examples, reference will now be made to the accompanying drawings in which.

DETAILED DESCRIPTION

Figure 1:
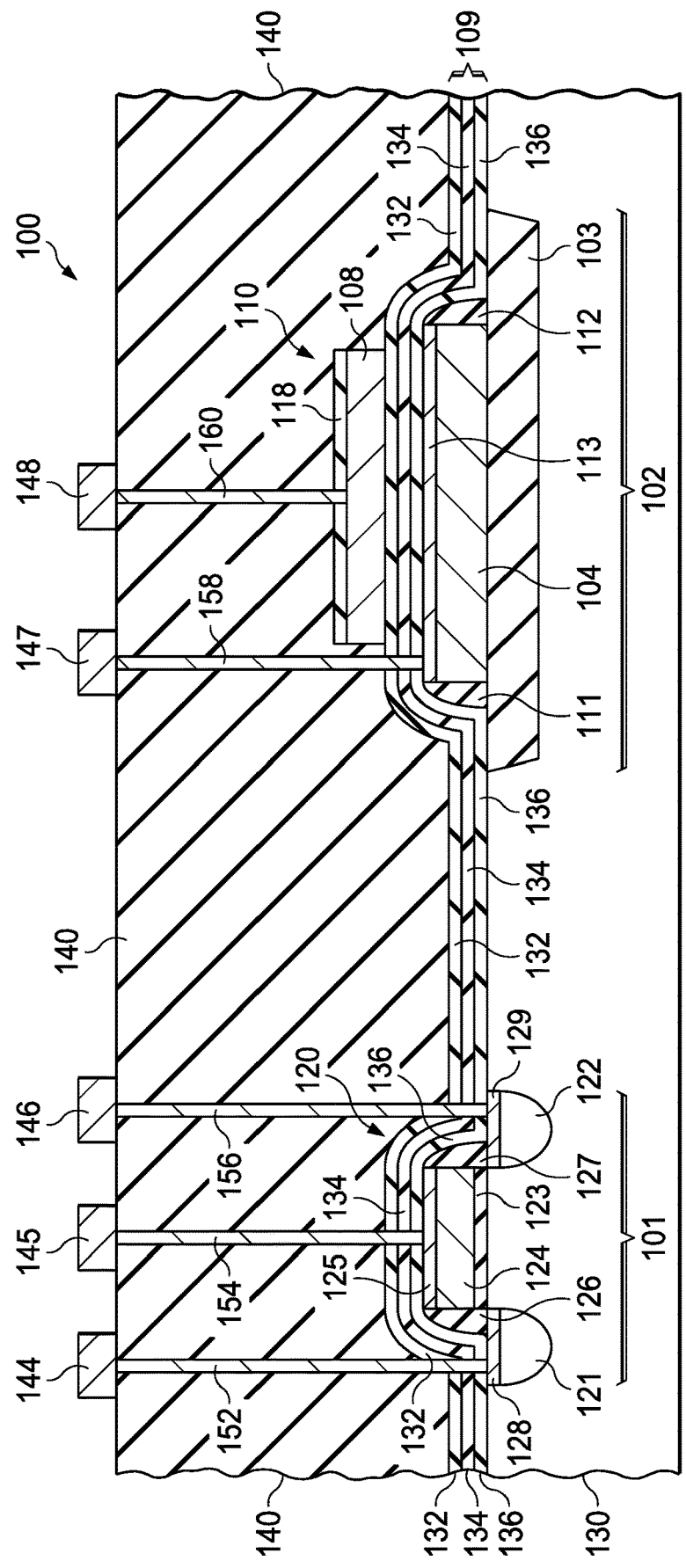
FIG. 1 depicts an illustrative integrated circuit that includes a precision capacitor and a transistor, in accordance with various examples.

High precision analog integrated circuits, such as analog-to-digital converters, often employ several precision capacitors for proper operation. For example, in a bit converter, some of the capacitor requirements are: a ratio stability of less than 0.00075% over 10 years; a voltage coefficient of less than 10 ppm/V; a temperature drift match of less than 0.05%/° C.; a dielectric absorption of less than 0.00075%; and a capacitance greater than 0.5 fF/µm2. Precision capacitors are generally formed as a part of a fabrication process employed to fabricate the analog integrated circuits. In some cases, precision capacitors are formed by placing a stack of multiple layers of dielectric material between two conductive plates. The conductive plates can be formed using a conductive material present in the integrated circuit such as titanium nitride, doped polycrystalline silicon and/or metals. The stack of multiple layers may include one or more layers of dielectric materials, such as silicon nitride and silicon dioxide. For example, a stack of multiple dielectric materials may include a first layer including silicon dioxide (SiO2), a second layer including silicon nitride (Si3N4), and a third layer including silicon dioxide, with one silicon dioxide layer contacting the top conductive plate, the other silicon dioxide layer contacting the bottom conductive plate, and the silicon nitride layer disposed between the two silicon dioxide layers. This stack of silicon dioxide, silicon nitride, and silicon dioxide is sometimes referred to as an ONO stack.

The currently-used fabrication process employs a silicon nitride ($Si_3N_4$) pre-metal dielectric (PMD) liner layer that provides tensile strength, protects the underlying transistors from the subsequently formed PMD material, and acts as an etch-stop layer during the formation of the openings for contacts to the transistor and precision capacitor through the PMD material. The PMD liner is typically deposited on the ONO stack, and having such an arrangement brings about additional challenges in that during the formation of the contact openings, the contact etch process has to alter the etch chemistry at multiple instances because different dry/wet etch chemistry is implemented to etch silicon nitride and silicon oxide layers. For example, to etch silicon oxide, a first etch chemistry including tetrafluoromethane/oxygen ($CF_4/O_2$) plasmas with admixed argon, hydrogen, and perfluorocyclopentene ($C_5F_8$) is needed. Whereas, to etch silicon nitride, a second etch chemistry including $CF_4$ plasma with admixed argon and difluoromethane ($CH_2F_2$). From a manufacturing perspective, changing the etch chemistry at multiple instances during the contact etch process is undesirable. Thus, a method of fabrication that mitigates the issues mentioned above is desirable.

Accordingly, the systems and methods described in the present disclosure mitigate the issues mentioned above. The present disclosure describes employing a dielectric stack including ONO that acts as a PMD liner layer in addition to performing the expected function of a dielectric. In particular, the silicon nitride present in the ONO stack performs the function of an etch stop layer and provides the beneficiary tensile strength to the underlying transistor. Employing such a multi-functional ONO stack eliminates the need to use a separate liner layer, and thus, reduces the number of instances at which the etch chemistry is changed.

Reference will now be made in detail to the examples illustrated in the accompanying figures. Wherever possible, the same reference numerals are used in the figures and the description to refer to the same or like parts. In the figures, the shape and thickness of one example may be exaggerated for clarity and convenience. Elements not specifically shown or described may take various forms. Further, when a layer is referred to as being on another layer or "on" a substrate, it may be directly on the other layer or on the substrate, or intervening layers may also be present.

FIG. 1 depicts an illustrative integrated circuit 100 that includes a precision capacitor 110 and a transistor 120, where the transistor 120 is formed in and on a semiconductor substrate 130. The semiconductor substrate 130, for example, may be a silicon wafer, a gallium arsenide wafer or other alloy compound semiconductor wafer, a silicon-on-insulator (SOI) wafer, or other substrate appropriate for formation of the integrated circuit 100. The precision capacitor 110 is formed over an isolation layer 103, where the isolation layer 103 is a thick silicon oxide layer (e.g., 3500-4500 A) and is used to prevent electric current leakage between adjacent semiconductor device components such as transistors. In some examples, isolation layer 103 is a shallow trench isolation (STI) region, and in other examples, isolation layer 103 is formed by locally oxidizing silicon (also referred as LOCOS layer/region).

The isolation layer 103 depicted in FIG. 1 is an STI layer and is created early during the semiconductor device fabrication process and before semiconductor device components are formed. The steps of the STI process include etching a pattern of trenches in the semiconductor substrate, depositing one or more dielectric materials (such as silicon dioxide) to fill the trenches, and removing the excess dielectric using a technique such as chemical-mechanical planarization. Forming this isolation layer 103 prior to fabricating the devices, divides the semiconductor substrate 130 into active and isolation regions (examples of such regions are shown in FIG. 1). Active region 101 is the position in the semiconductor substrate 130 where active devices such as transistors are formed, whereas isolation region 102 is the region that isolates the active devices.

In the instant example, the precision capacitor 110 includes a bottom plate 104, a top plate 108, and a composite dielectric layer 109 disposed between the bottom plate 104 and top plate 108. In some examples, the bottom plate 104 includes polycrystalline silicon, commonly referred to as polysilicon, which is about 50 nanometers to 1000 nanometers thick, and possibly includes a metal silicide layer 113 on the bottom plate 104. The metal silicide layer 113 may include, for example, titanium silicide, tungsten silicide, platinum silicide, cobalt silicide, molybdenum silicide or nickel silicide. In some examples, dielectric sidewalls 111 and 112 may be present on the lateral surfaces of the bottom plate 104.

The top plate 108 may include, for example, one or more layers of titanium, titanium nitride, tantalum, tantalum nitride, titanium tungsten and/or tungsten, with a thickness of about 20 nanometers to 300 nanometers. The bottom plate 104, the composite dielectric layer 109 and the top plate 108 form the precision capacitor 110. Lateral dimensions of the precision capacitor 110 may be controlled by photolithographic and etch processes used to define lateral dimensions of the top plate 108.

The composite dielectric layer 109 may include multiple sublayers, for example, first, second, and third sublayers, 132, 134, and 136. The first sublayer 132 comprises a first chemical composition, the second sublayer 134 comprises a second different chemical composition, and the third sublayer 136 comprises a chemical composition substantially similar to the first chemical composition. In one example, the first sublayer 132 includes silicon oxide, the second sublayer 134 includes silicon nitride, and the third sublayer 136 includes silicon oxide. Together, the composite dielectric layer 109 may be denoted to as an ONO stack, where O refers to silicon oxide, and N refers to silicon nitride. The integrated circuit 100 also includes another dielectric layer 118 located directly on and being laterally coextensive with the top plate 108. The dielectric layer 118, in one example, includes hard mask materials such as silicon nitride, silicon carbide or amorphous carbon.

Refer now to the transistor 120, which includes a gate dielectric layer 123 of a metal oxide semiconductor (MOS) transistor. The gate dielectric layer 123 is formed at a top surface of the semiconductor substrate 130. Source region 121 and drain region 122 of the transistor 120 are formed in the semiconductor substrate 130 below to a gate electrode 124. The gate electrode 124, in some examples, may include polysilicon. Metal silicide layers 125, 128, and 129 may optionally be formed on the gate electrode 124, the source region 121, and the drain region 122. The metal silicide layers 125, 128, and 129 may include, for example, titanium silicide, tungsten silicide, platinum silicide, cobalt silicide, molybdenum silicide or nickel silicide. In some examples, dielectric sidewalls 126 and 127 may be present on the lateral surfaces of the gate electrode 124.

The composite dielectric layer 109 is also disposed on the gate electrode 124 and acts both as an etch stop and pre-metal dielectric liner layer. The second sublayer 134 of the composite dielectric layer 109 is a nitride layer and is configured to provide tensile stress in the transistor 120 to enhance the carrier mobility, thereby facilitating high-speed, low power, low voltage device operation. The second sublayer 134 is a nitride layer and can include any silicon nitride material. The second sublayer 134 also acts as an etch-stop material during formation of openings for contacts to transistor terminals through an overlying dielectric, such as pre-metal dielectric layer 140 or PMD layer 140. The PMD layer 140 may include, for example, boron phosphorus silicate glass (BPSG). A top surface of the PMD layer 140 may be, for example, 100 nanometers to 2000 nanometers above the top surface of the semiconductor substrate 130.

The integrated circuit 100 also includes conductive contacts 152, 154, 156, 158, and 160 that are formed through the PMD layer 140 and through portions of the composite dielectric layer 109 and form connection between metal interconnects 144, 145, 146, 147, and 148, respectively, present on the top surface of the PMD layer 140. The conductive contacts 152, 154, and 156 form contact with the transistor terminals (e.g., the silicided transistor gate electrode 124, silicided source region 121, and silicided drain region 122, respectively) and the conductive contacts 158 and 160 form contact with capacitor terminals (e.g., silicided bottom plate 104 and top plate 108, respectively).

The metal interconnects 144-148 are present on a first level. FIG. 1 does not explicitly show other metal interconnects present on succeeding levels. The metal interconnects 144-148 provide electrical interconnection between various electrical components in the integrated circuit 100, wherein each level includes an inter-level or inter-layer dielectric (ILD) formed over a preceding level, with conductive contacts (also referred to as vias) and/or trenches formed therein and filled with conductive material (e.g., copper, etc.).

Figure 2:
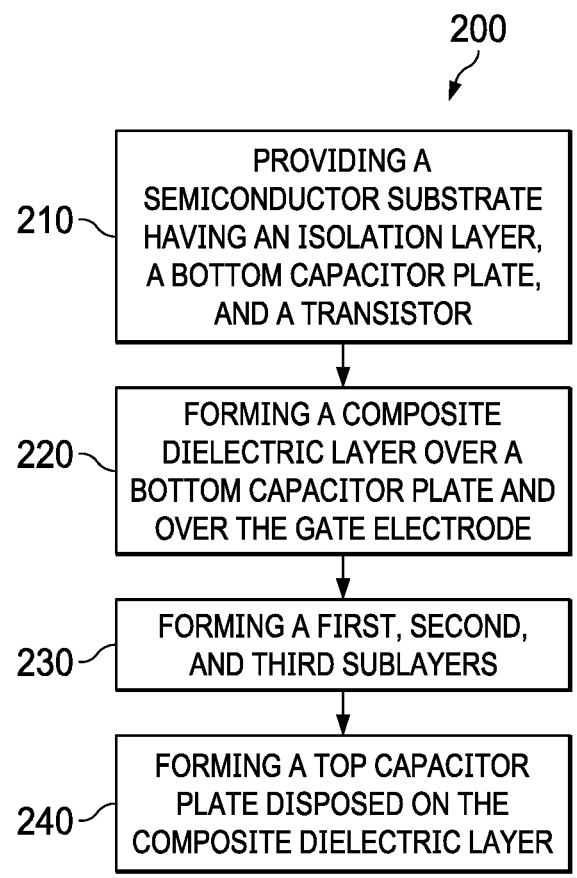
FIG. 2 depicts an illustrative method describing the method of fabrication of the integrated circuit, in accordance with various examples.

Referring now to FIG. 2, an illustrative method 200 describing the method of fabrication of the integrated circuit 100 is shown. Although the method 200 is illustrated and described below as a series of acts or events, it should be appreciated that the fabrication method of the integrated circuit 100 is not limited by the illustrated ordering of such acts or events. For example, some acts may occur in different orders and/or concurrently with other acts or events apart from those illustrated and/or described herein. Also, not all illustrated steps may be needed to implement a methodology.

The method 200 is described in tandem with FIGS. 3(a)-3(j), which depict the fabrication of the integrated circuit 100 in successive stages of fabrication. The method 200 begins with block 210 that includes providing the semiconductor substrate 130 including the isolation layer 103, the bottom plate 104, and the gate electrode 124 (FIG. 3(e)).

Figure 3A:
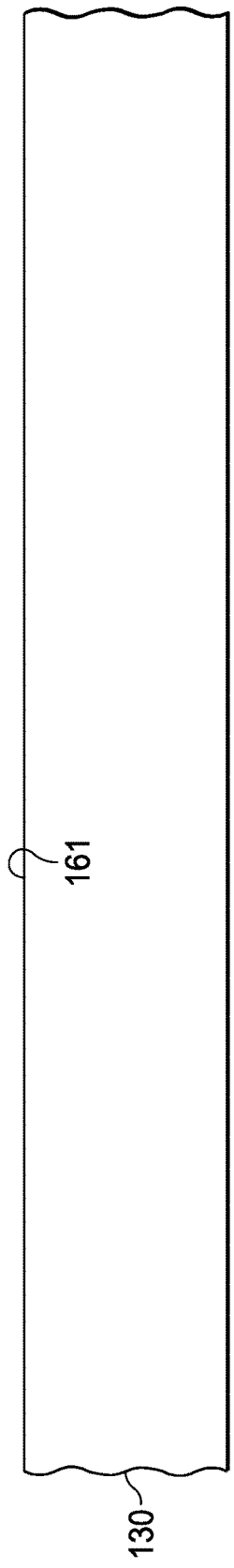
FIGS. 3(a)-3(j) depict fabrication of the integrated circuit in successive stages of fabrication, in accordance with various examples.
Figure 3B:
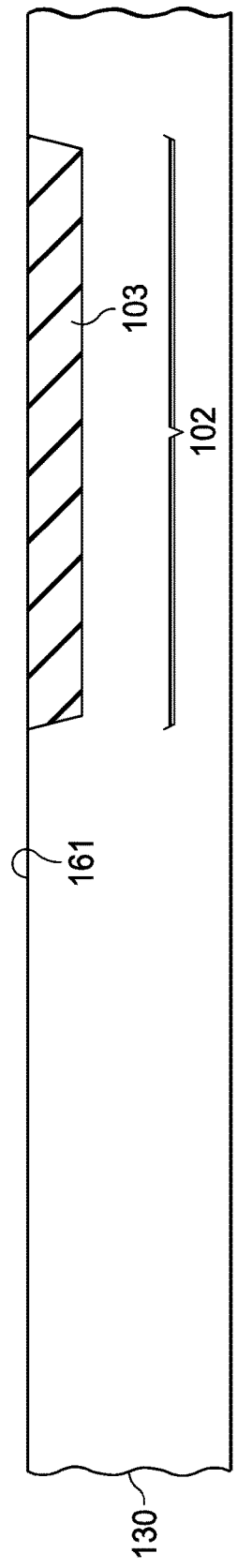
Figure 3C:
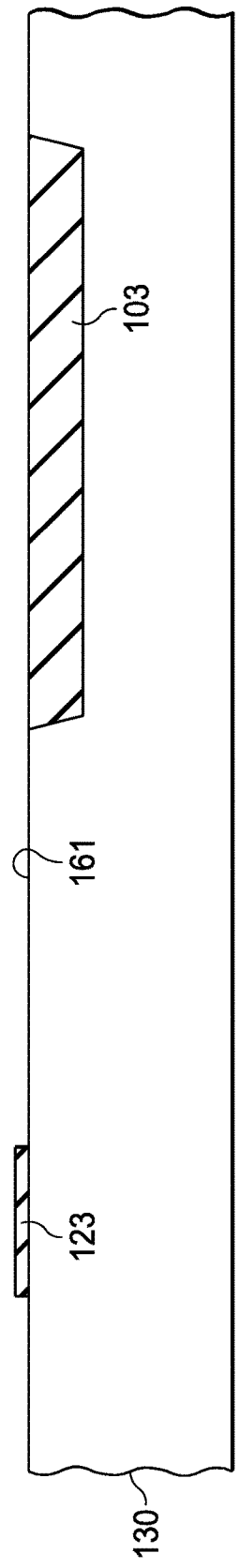
Figure 3D:
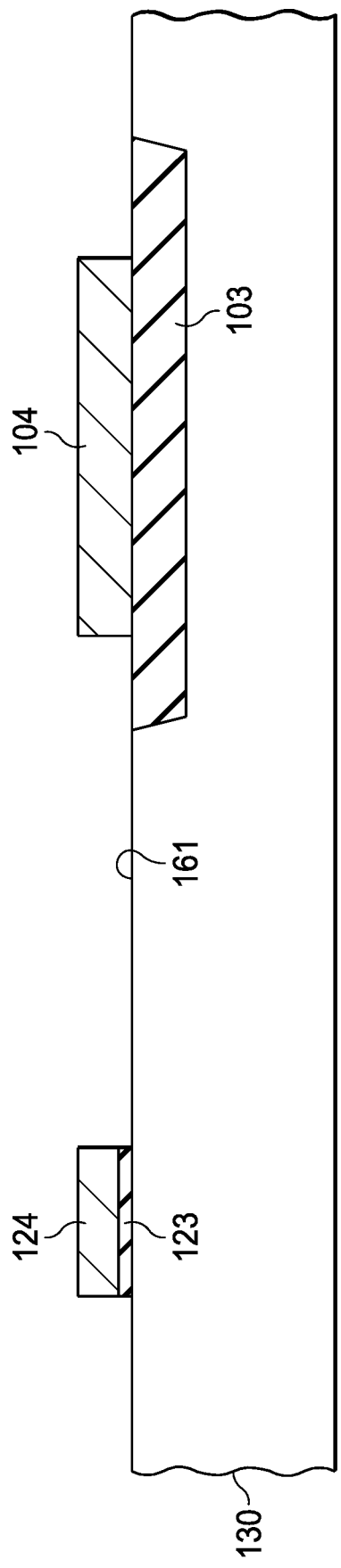
Figure 3E:
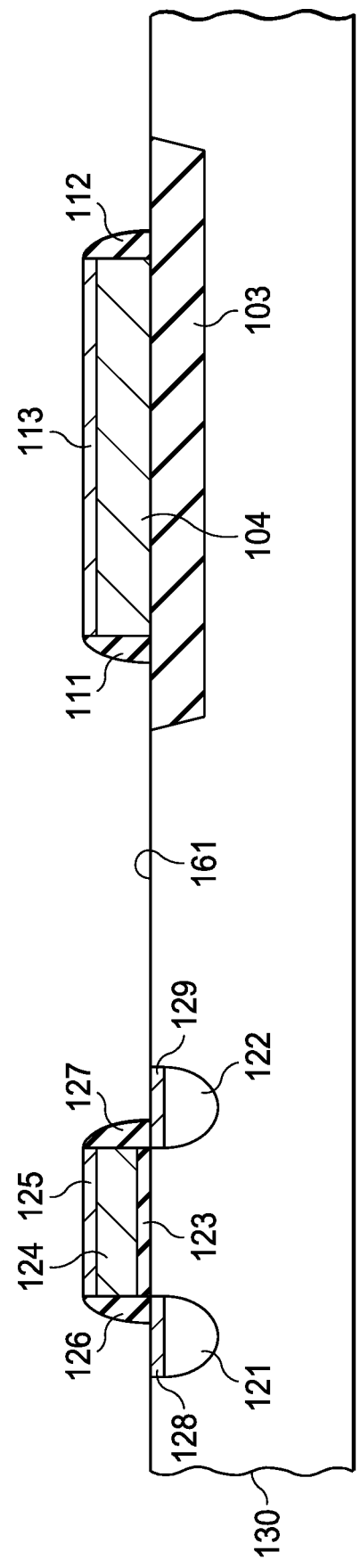

Multiple fabrication processes may be performed before obtaining the semiconductor substrate 130 as shown in FIG. 3(e), and those steps are described with respect to FIGS. 3(a)-3(e). The method 200 may be preceded by performing various front-end processing steps, including the formation of n and p wells using diffusion, implantation, or other suitable processing steps (FIG. 3(a)). The n and p wells are not explicitly shown in FIG. 3(a). FIG. 3(a) depicts the semiconductor substrate 130 having a top surface 161. The front-end processing steps may further include the formation of isolation structures in field regions of the semiconductor substrate 130, using LOCOS, STI, or any suitable isolation processing prior to transistor formation. FIG. 3(b) depicts the isolation layer 103 that is formed using a STI fabrication process. The steps of the STI process include etching a pattern of trenches in the semiconductor substrate, depositing one or more dielectric materials (such as silicon dioxide) to fill the trenches, and removing the excess dielectric materials using a technique such as chemical-mechanical planarization.

The isolation layer 103, as described above, forms active and isolation regions in the semiconductor substrate 130. The isolation region 102 is shown in FIG. 3(b). After the formation of the isolation layer 103, prospective channels regions of the semiconductor body may also be initially doped to adjust the prospective transistor work functions, to suppress punch-through, etc. Following that, a gate dielectric (e.g., the gate dielectric layer 123, FIG. 3(c) may be formed by oxidizing the semiconductor substrate 130 (e.g., silicon) to form a thin (e.g., 5-200 nm) insulating layer of the gate dielectric layer (e.g., silicon dioxide) on the top surface 161, and a conductive gate structure (e.g., gate electrode 124; FIG. 3(d)) along with the bottom plate 104 may then be formed above the gate dielectric layer 123 and the isolation layer 103, respectively, using deposition and patterning of doped polysilicon or other conductive material.

Further, source region 121 and drain region 122 may then be doped using suitable dopant species for n-channel or p-channel transistors, such as through selective implantation (FIG. 3(e)). Following source/drain region formation, silicide processing may then be performed to create conductive contacts at the transistor terminals. For example, metal silicide layers 125, 128, 129, may be formed on the source region 121, drain region 122, and the gate electrode 124, respectively, using any suitable materials (e.g., nickel silicide, cobalt silicide, etc.). Silicide processing may also be performed to create conductive contacts at the bottom plate 104. For example, the metal silicide layer 113 may be formed during the silicide processing step. In addition to silicide processing, in some examples, sidewalls may be formed on the lateral surfaces of the gate electrode 124 and the bottom plate 104. For example, dielectric sidewalls 126 and 127 may be formed at the lateral surfaces of the gate electrode 124, and dielectric sidewalls 111 and 112 may be formed at the lateral surfaces of the bottom plate 104. FIG. 3(e) depicts the transistor 120.

Figure 3F:
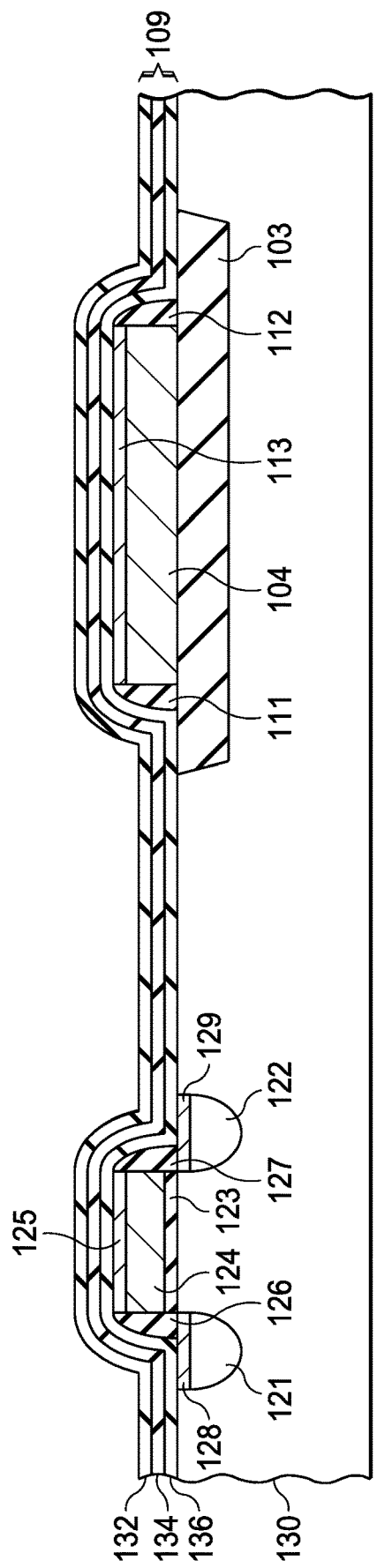

Method 200 now may proceed to block 220 (and FIG. 3(f)) that includes forming the composite dielectric layer 109 over the bottom plate 104 and the gate electrode 124. The composite dielectric layer 109 includes multiple sublayers (e.g., sublayers 132, 134, and 136), where at least one of the sublayers (e.g., sublayer 134) is a nitride layer (block 230; FIG. 3(f)) and the sublayers 132, 136 are oxide layers. In one example, the composite dielectric layer 109 may be formed using plasma enhanced chemical vapor deposition (PECVD) using a relatively low deposition temperature of about 350° C., or less. The PECVD deposition process may employ a PECVD chamber, and begins with deposition of the third sublayer 136, e.g., silicon oxide. In some examples the third sublayer 136 is deposited by a nominal process parameters that include a deposition temperature of 350° C., a pressure of 8 Torr (about 1067 Pa), high-frequency (HF) RF power of 312 W, a silane (SiH$_4$) flow rate of 42 sccm, a helium (He) flow rate of 8000 sccm, a nitrous oxide (N$_2$O) flow rate of 1420 sccm, and a target thickness of 9 nm. "High-frequency" is defined as being in a frequency range from about 13 MHz to about 15 MHz. Optionally, the parameters may be selected in corresponding ranges as follows: temperature, 325° C. to 425° C.; pressure 6.4 Torr (853 Pa) to 9.6 Torr (1280 Pa); HF RF power, 230 W to 390 W; a SiH$_4$ flow rate, 34 sccm to 50 sccm; He flow rate, 6400 sccm to 9600 sccm; N$_2$O flow rate, 1130 sccm to 1700 sccm; and target thickness, 5 nm to 20 nm.

In some examples, the second sublayer 134 is deposited directly on the third sublayer 136, and it may be preferable to do so without breaking vacuum in the deposition chamber. Deposition conditions may include controlling the PECVD chamber pressure to about 2.5 Torr (about 333 Pa) and providing silane (SiH$_4$) gas with a flow rate of about 175 sccm±20%, ammonia (NH$_3$) gas with a flow rate of about 400 sccm, nitrogen gas with a flow rate of about 8000 sccm and high-frequency RF power at about 230 W. A nominal thickness of about 22 nm may be targeted. This illustrative PECVD process provides a chemically stable silicon nitride film (e.g., Si$_x$N$_y$, where X is approximately 3 and Y is approximately 4 in one example) with low hydrogen content, with the hydrogen being bonded about equally with silicon (e.g., Si—H bonds) and with nitrogen (e.g., N—H bonds). Moreover, this as-deposited stable nitride film imparts a moderate initial tensile stress to the transistor (0-600 MPa in this example). Optionally, the deposition parameters of the second sublayer 134 may be selected in corresponding ranges as follows: temperature, 325° C. to 425° C.; pressure 2 Torr (267 Pa) to 3 Torr (400 Pa); HF RF power, 170 W to 290 W; SiH$_4$ flow rate between 140 sccm and 210 sccm; NH$_3$ flow rate between 320 sccm and 480 sccm; and N$_2$ flow rate between 6400 sccm and 9600 sccm. The thickness may be in a range between 15 nm and 50 nm. In some examples, the first sublayer 132 is deposited directly on the second sublayer 134, and it may be preferable to do so without breaking vacuum in the deposition chamber.

The first sublayer 132 may optionally be formed using the same process conditions used to form the third sublayer 136, and the process conditions may be selected in the same ranges as those described for the third sublayer 136. A nominal thickness of the third sublayer 136 may be 13 nm, and the thickness may be in a range between 5 nm and 20 nm.

Figure 3G:
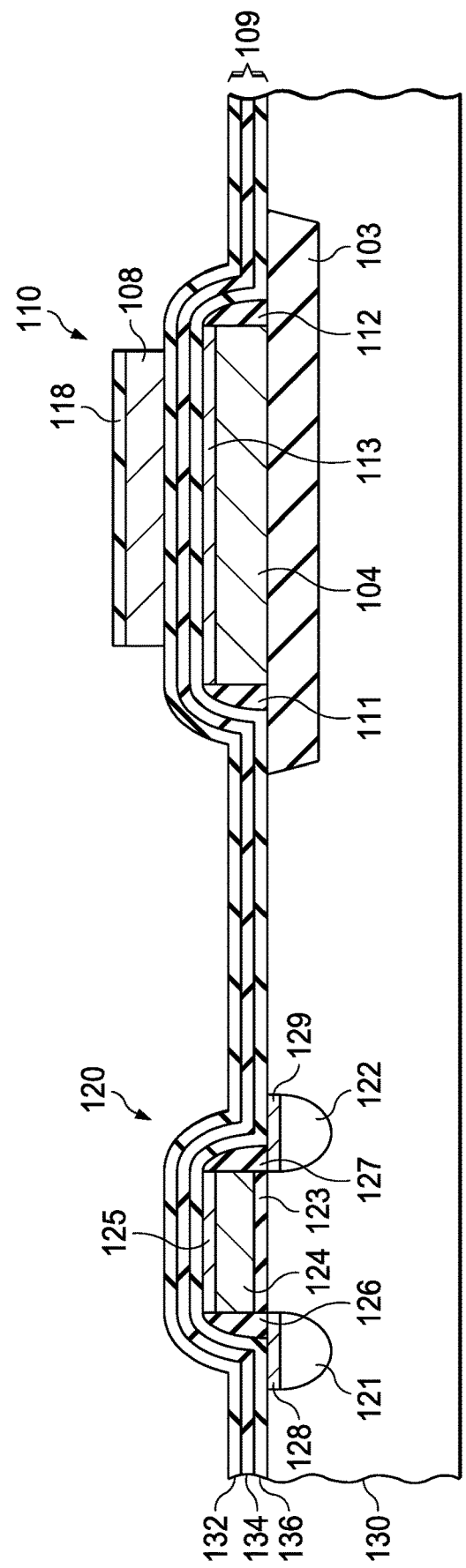

Method 200 then proceeds to block 240 that includes forming the top plate 108 on the composite dielectric layer 109 (FIG. 3(g)). The top plate 108 may be formed by depositing a conductive layer such as TiN (or other metal-containing material) directly on the first sublayer 132, and a photoresist layer on the conductive layer. The photoresist layer is then patterned, and the conductive layer is etched to form the top plate 108. In some examples, a dielectric layer may also be deposited on the conductive layer. In such examples, the photoresist layer is deposited and patterned on the dielectric layer, and the dielectric layer may be patterned first, e.g., as a hardmask, thereby forming the dielectric layer 118. The conductive layer may then be etched to form the top plate 108.

Figure 3H:
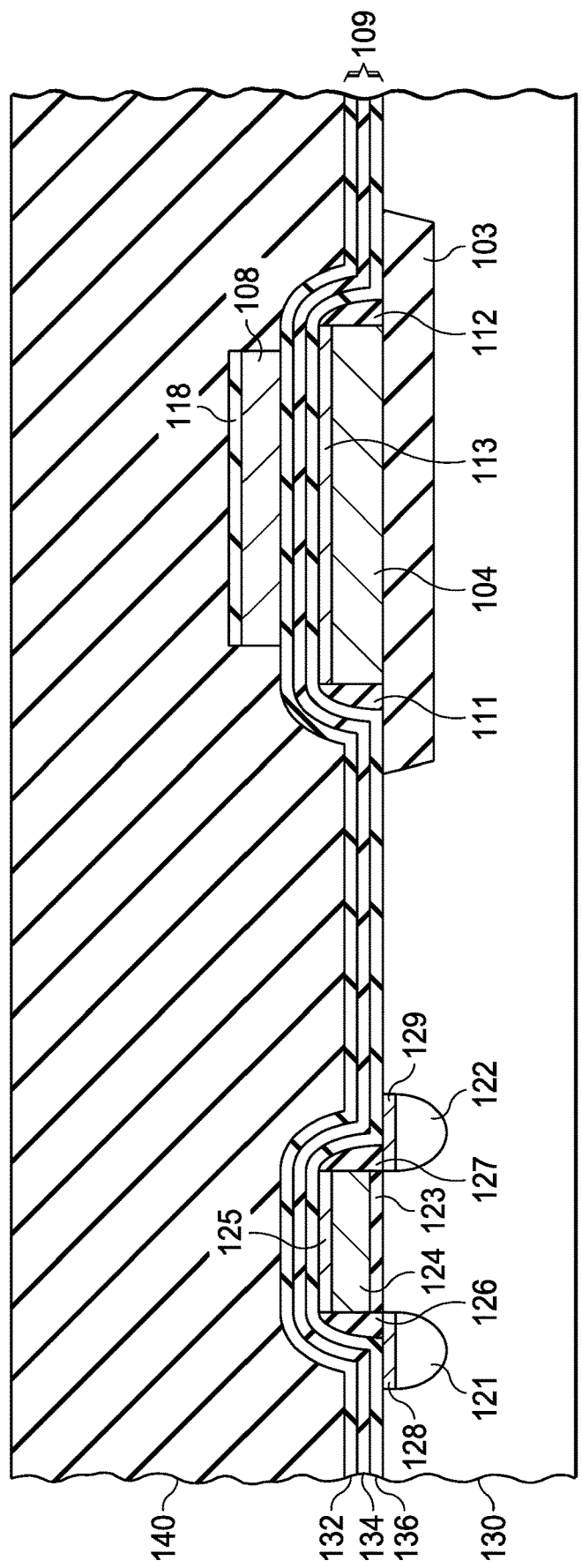
Figure 3I:
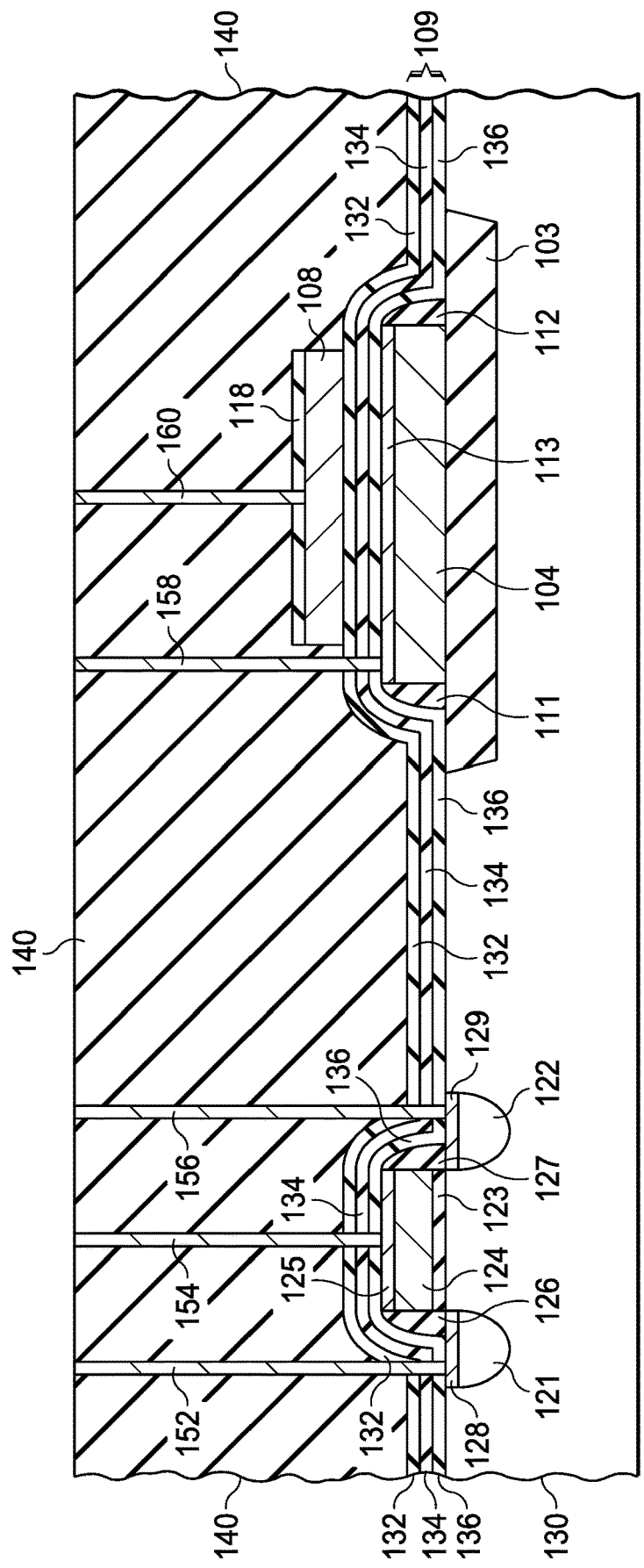

FIG. 3(h) depicts PMD layer 140, which is formed by depositing, for example, boron phosphorus silicate glass (BPSG) or silicon dioxide on the exposed portions of the composite dielectric layer 109, the top surface of the dielectric layer 118, and the sidewalls of the top plate 108 and the dielectric layer 118. The PMD layer 140 may be deposited using a chemical vapor deposition process. The PMD layer 140, in some examples, may be deposited to the thickness of 100 nanometers to 2000 nanometers. FIG. 3(i) depicts the conductive contacts 152, 154, 156, 158, and 160 that are formed through the PMD layer 140 and portions of the composite dielectric layer 109 to form connections between different metal interconnects. The conductive contacts 152, 154, and 156 form conductive connections with the transistor terminals (e.g., the silicided transistor gate electrode 124, silicided source region 121, and silicided drain region 122, respectively) and the conductive contacts 158 and 160 form conductive connections with the capacitor terminals (e.g., silicided bottom plate 104 and the top plate 108, respectively). The conductive contacts 152, 154, 156, 158, and 160 may be formed by first etching portions of the PMD layer 140 to form openings and then depositing conductive material in the openings as described below to form the conductive contacts. The following steps may be employed to create the openings: the top side of the PMD layer 140 is first patterned with a contact mask; and then the PMD layer 140 is dry etched. The dry etching is performed using the first etch chemistry including tetrafluoromethane/oxygen ($CF_4$/$O_2$) plasmas with admixed argon, hydrogen, and perfluorocyclopentene (C5F8). The first etch chemistry automatically stops etching at the second sublayer 134, which is a nitride layer and acts as an etch stop. At this point, the dry etching process is performed using the second etch chemistry that is compatible to etch away the second sublayer 134, where the second etch chemistry includes $CF_4$ plasma with admixed argon and difluoromethane ($CH_2F_2$). The second chemistry automatically stops etching as the second sublayer 134 is etched away, and the dry etching process reaches at the third sublayer 136. At this point, the first etch chemistry of the dry etching process is re-established to etch through the third sublayer 136.

Figure 3J:
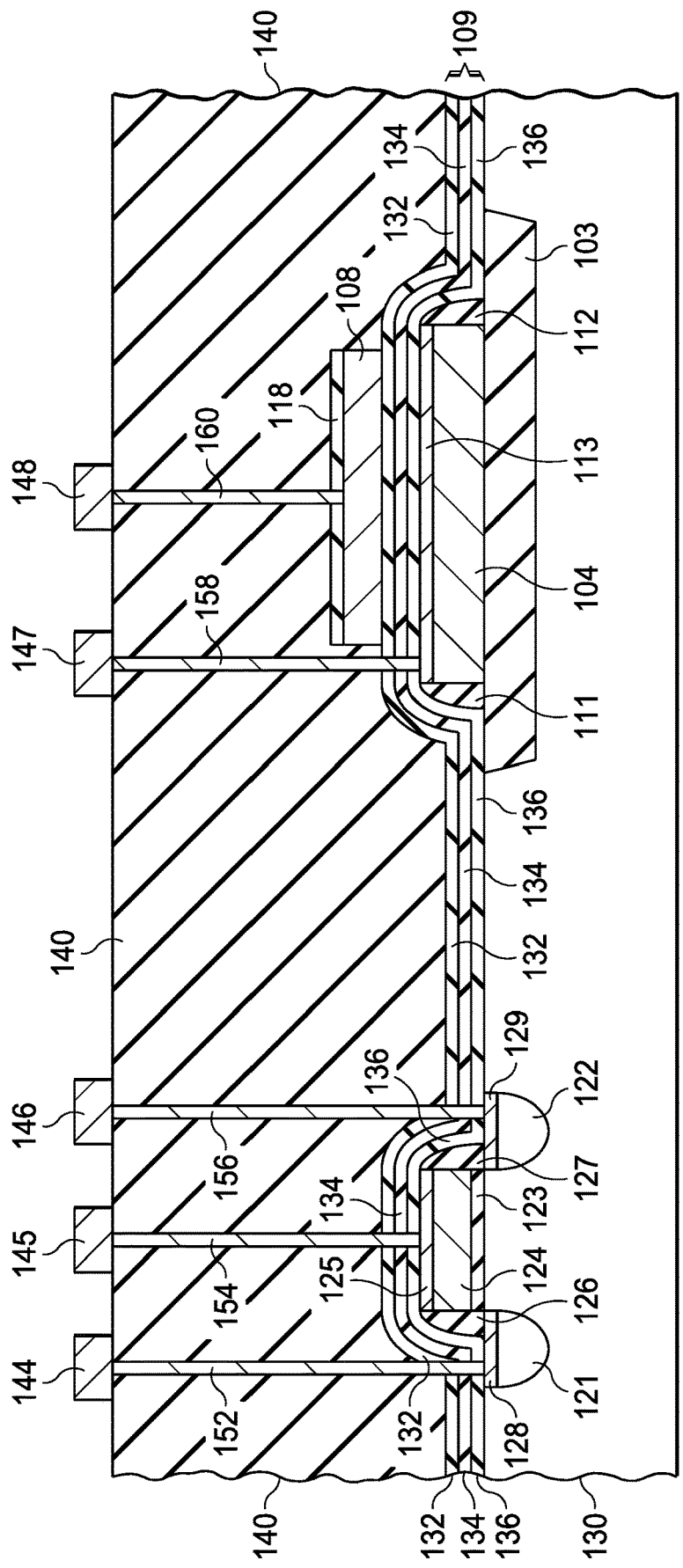

After openings are created in the PMD layer 140, the conductive contacts 152, 154, 156, 158, and 160 may be formed using the following steps. First, a thin barrier film of titanium is deposited by a suitable deposition process on the bottom and inside of the trenches. Then, a titanium nitride layer is deposited over the titanium. Finally, the openings are filled with tungsten using CVD (chemical vapor deposition) process. FIG. 3(j) depicts the metal interconnects 144-148 that are present on the top surface of the PMD layer 140. The metal interconnects 144-148 may be formed by first depositing a stack of titanium, titanium nitride, and aluminum-copper alloy using a deposition (e.g., CVD) process and then patterning it.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means +/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A method of manufacturing an integrated circuit, comprising the steps of:
providing a semiconductor substrate including:
an isolation layer disposed on or over the semiconductor substrate; and
a first conductive plate located over the isolation layer; and
forming a composite dielectric layer over the first conductive plate, the forming including:
forming a first sublayer and a second sublayer each having a substantially same first chemical composition;
forming a third sublayer between the first and second sublayers, the third sublayer having a second different chemical composition including silicon, nitrogen and hydrogen; and
forming a second conductive plate located directly on the composite dielectric layer;
forming a second dielectric layer on the second conductive plate;
depositing a pre-metal dielectric (PMD) layer over the composite dielectric layer and the second dielectric layer, the PMD layer comprising boron phosphorus silicate glass and having a top side;
forming a plurality of contacts, the forming of the plurality of contacts comprising:
performing a first dry etch process with a first etch chemistry compatible to etch through the PMD layer and the second sublayer, wherein the first etch chemistry comprises tetrafluromethane/oxygen ($CF_4$/$O_2$) plasmas with admixed argon (Ar), hydrogen ($H_2$) and perflurocyclopentene ($C_5F_8$), and wherein the third sublayer functions as an etch stop layer for the first etch chemistry;
performing a second dry etch process with a second etch chemistry compatible to etch through the third sublayer, wherein the second etch chemistry comprises tetrafluromethane ($CF_4$) plasma with admixed argon and difluromethane ($CH_2F_2$), and wherein the first sublayer functions as an etch stop layer for the second etch chemistry;
resuming the first dry etch process with the first etch chemistry compatible to etch through the first sublayer to form a plurality of contact openings; and
filling the plurality of contact openings with a conductive material;
wherein forming the third sublayer includes providing silane at a flow rate in a range between 175 sccm and 210 sccm, ammonia at a flow rate in a range between 320 and 480 sccm, and nitrogen at a flow rate in a range between 6400 and 9600 sccm, and providing high-frequency RF power of about 230 W, with a substrate temperature of about 350° C. during forming of the first, second and third sublayers, and the third sublayer includes hydrogen bonded about equally with silicon and with nitrogen.

2. The method of claim 1, further comprising forming the composite dielectric layer over a gate electrode of a transistor, wherein the third sublayer imparts a tensile stress in the transistor.

3. The method of claim 2 further comprising:
forming respective ones of the plurality of contacts that extend from the top side to the gate electrode, the first conductive plate, and the second conductive plate.

4. The method of claim 2 further comprising forming silicide contacts on the gate electrode and the first conductive plate.

5. The method of claim 1, wherein forming the first and second sublayers includes providing high-frequency RF power of about 312 W, and flowing helium, and nitrous oxide at about 8000 sccm and 1420 sccm, respectively.

6. The method of claim 1, wherein the third sublayer comprises silicon nitride.

7. The method of claim 1, wherein the first conductive plate is formed from polysilicon and the second conductive plate is formed from a metal.

8. A method of manufacturing an integrated circuit, comprising:
forming a composite dielectric layer over a first conductive plate and over a gate of a transistor, the first conductive plate and the transistor located over a semiconductor substrate, the forming including:
forming a first sublayer and a second sublayer each having a substantially same first chemical composition;
forming a third sublayer between the first and second sublayers, the third sublayer having a second different chemical composition; and
forming a second conductive plate located directly on the composite dielectric layer over the first conductive plate;
forming a second dielectric layer on the second conductive plate;
depositing a pre-metal dielectric (PMD) layer over the composite dielectric layer and the second dielectric layer, the PMD layer comprising boron phosphorus silicate glass and having a top side;
forming a plurality of contacts, the forming of the plurality of contacts comprising:
patterning the top side of the PMD layer with a contact mask;
performing a first dry etch process with a first etch chemistry compatible to etch through the PMD layer and the second sublayer, wherein the first etch chemistry comprises tetrafluromethane/oxygen ($CF_4/O_2$) plasmas with admixed argon (Ar), hydrogen ($H_2$) and perflurocyclopentene ($C_5F_8$), and wherein the third sublayer functions as an etch stop layer for the first etch chemistry;
performing a second dry etch process with a second etch chemistry compatible to etch through the third sublayer, wherein the second etch chemistry comprises tetrafluromethane ($CF_4$) plasma with admixed argon and difluromethane ($CH_2F_2$), and wherein the first sublayer functions as an etch stop layer for the second etch chemistry;
resuming the first dry etch process with the first etch chemistry compatible to etch through the first sublayer to form a plurality of contact openings; and
filling the plurality of contact openings with a conductive material;
wherein forming the third sublayer includes providing high-frequency RF power of about 230 W, and flowing silane, ammonia and nitrogen, at 175 sccm, 400 sccm, and 8000 sccm, respectively, with a substrate temperature of about 350° C., and the third sublayer comprises silicon nitride including hydrogen bonded about equally with silicon and with nitrogen.

9. The method of claim 8, wherein the third sublayer includes nitrogen, and the first and second sublayers exclude nitrogen.

10. The method of claim 8, further comprising forming an electrical contact of the plurality of contacts to the first conductive plate through the composite dielectric layer.

11. The method of claim 8, wherein an extended portion of the first conductive plate extends past the second conductive plate, and further comprising:
forming a first electrical contact of the plurality of contacts to the extended portion of the first conductive plate through the composite dielectric layer; and
forming a second electrical contact of the plurality of contacts to the second conductive plate.

12. The method of claim 11, further comprising:
forming third and fourth electrical contacts of the plurality of contacts to respective source and drain of the transistor and a fifth electrical contact of the plurality of contacts to the gate, the third, fourth and fifth electrical contacts passing through the composite dielectric layer.

13. The method of claim 8, wherein the first conductive plate and the transistor gate are formed from a same material layer.

14. The method of claim 8, wherein the first and second sublayers comprise silicon oxide and the third sublayer comprises silicon nitride.

15. The method of claim 8, wherein the first, second and third sublayers are formed in a plasma reactor without breaking vacuum between forming the first sublayer and the third sublayer, and without breaking vacuum between forming the third sublayer and the second sublayer.

16. The method of claim 8, wherein the first conductive plate is formed directly on an isolation layer formed on or in the semiconductor substrate.

17. The method of claim 16, wherein the isolation layer is a shallow trench isolation layer.

18. The method of claim 8, wherein the first conductive plate is formed from polysilicon and the second conductive plate is formed from a metal.

19. The method of claim 8, wherein the ratio of ammonia to silane is about 2.3.

20. A method of manufacturing an integrated circuit, comprising:
receiving a semiconductor substrate including:
an isolation layer disposed on or over the semiconductor substrate; and a first conductive plate located over the isolation layer;
forming a composite dielectric layer over the first conductive plate, the forming including:
forming a first silicon oxide layer over the first conductive plate;
forming a silicon nitride layer over first silicon oxide layer;
forming a second silicon oxide layer over the silicon nitride layer; and
forming a second conductive plate located directly on the second silicon oxide layer over the first conductive plate, forming a second dielectric layer on the second conductive plate;

depositing a pre-metal dielectric (PMD) layer over the composite dielectric layer and the second dielectric layer, the PMD layer comprising boron phosphorus silicate glass and having a top side;

forming a plurality of contacts, the forming of the plurality of contacts comprising:

patterning the top side of the PMD layer with a contact mask;

performing a first dry etch process with a first etch chemistry compatible to etch through the PMD layer and the second silicon oxide layer, wherein the first etch chemistry comprises tetrafluromethane/oxygen ($CF_4/O_2$) plasmas with admixed argon (Ar), hydrogen ($H_2$) and perflurocyclopentene ($C_5F_8$), and wherein the silicon nitride layer functions as an etch stop layer for the first etch chemistry;

performing a second dry etch process with a second etch chemistry compatible to etch through the silicon nitride layer, wherein the second etch chemistry comprises tetrafluromethane ($CF_4$) plasma with admixed argon and difluromethane ($CH_2F_2$), and wherein the first silicon oxide layer functions as an etch stop layer for the second etch chemistry;

resuming the first dry etch process with the first etch chemistry compatible to etch through the first silicon oxide layer to form a plurality of contact openings; and filling the plurality of contact openings with a conductive material;

wherein the silicon nitride layer includes hydrogen bonded about equally with silicon and with nitrogen.

* * * * *